United States Patent
Kadota et al.

(10) Patent No.: US 6,369,667 B1
(45) Date of Patent: Apr. 9, 2002

(54) SURFACE ACOUSTIC WAVE DEVICE AND COMMUNICATION DEVICE UTILIZING SHEAR HORIZONTAL WAVES

(75) Inventors: Michio Kadota, Kyoto; Toshimaro Yoneda, Ishikawa-ken; Koji Fujimoto, Otsu, all of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/561,757

(22) Filed: Apr. 26, 2000

(30) Foreign Application Priority Data

May 14, 1999 (JP) .......................... 11-134474

(51) Int. Cl.⁷ .................. H03H 9/64; H03H 9/72
(52) U.S. Cl. .............. 333/133; 333/193; 333/195; 310/313 A; 310/313 B; 310/360
(58) Field of Search .............. 333/133, 193–196; 310/313 R, 313 A, 313 B, 313 C, 313 D, 360

(56) References Cited

U.S. PATENT DOCUMENTS

| 5,204,575 A | * 4/1993 | Kanda et al. ........ 310/313 B |
| 5,432,392 A | * 7/1995 | Kadota et al. ........ 310/313 A |
| 5,684,437 A | * 11/1997 | Ago et al. ............ 333/195 |
| 5,847,486 A | * 12/1998 | Kadota et al. ........ 310/313 R |
| 5,953,433 A | * 9/1999 | Fujimoto et al. ...... 381/337 |
| 5,977,686 A | 11/1999 | Kadota et al. ........ 310/313 B |
| 6,088,462 A | * 7/2000 | Fujimoto et al. ...... 381/160 |
| 6,127,769 A | * 10/2000 | Kadota et al. ........ 310/313 B |

FOREIGN PATENT DOCUMENTS

| EP | 0 860 943 | 8/1998 |
| EP | 1 037 382 A2 | 9/2000 |
| EP | 1037384 A2 | 9/2000 |
| GB | 2 186 456 | 8/1987 |
| GB | 2 210 226 | 6/1989 |
| JP | 58-129818 | 8/1983 |
| JP | 5-267981 | 10/1993 |

* cited by examiner

*Primary Examiner*—Benny Lee
*Assistant Examiner*—Barbara Summons
(74) *Attorney, Agent, or Firm*—Keating & Bennett, LL.

(57) ABSTRACT

A surface acoustic wave device includes a quartz substrate having Euler angles (0°, θ, 90°±5°) in which θ is in a range of 119°≦θ≦140°, and an IDT for exciting an SH wave is formed on the quartz substrate by use of an electrode material containing as a major component at least one of Ag, Mo, Cu, Ni, Cr, and Zn and having a density of at least about 7 g/cm³. The film thickness of the IDT is such that the attenuation constant is approximately zero.

19 Claims, 6 Drawing Sheets

SURFACE ACOUSTIC WAVE DEVICE AND COMMUNICATION DEVICE UTILIZING SHEAR HORIZONTAL WAVES

BACKGROUND OF THE INVENTION

1. Field of the Invention

The present invention relates to a surface acoustic wave device such as a surface acoustic wave resonator, a surface acoustic wave filter, a duplexer, or other such devices, and more particularly to a surface acoustic wave device using a Shear Horizontal (SH) type wave.

2. Description of the Related Art

Surface acoustic wave devices have been widely used for band-pass filters in mobile radio communication apparatuses and other types of communication devices. Various types of surface acoustic wave devices are commercially produced for various applications. Among such surface acoustic wave devices, a SH type surface acoustic wave device including a quartz substrate and an interdigital transducer (IDT) made of Ta, W or Au is disclosed in, for example, EP0860943A2.

In such a surface acoustic wave device, a metallic film is formed on a piezoelectric substrate that is made of quartz, or other suitable material, by evaporating or sputtering a metal such as Ta, W, and Au, and then electrode fingers defining the IDT of the surface acoustic wave device are generally formed by producing patterns of the metallic film by a method such as photo-etching. Resonance frequency of the surface acoustic wave device is mostly determined by the space between electrode fingers defining the IDT, the film thickness, and the width of the electrode fingers.

When the surface acoustic wave device is manufactured by the above-mentioned processes, a problem occurs in that the width of the electrode finger and the film thickness are different or varied in every wafer due to the lack of accuracy in controlling process parameters. These variations cause variations in frequency of the surface acoustic waves generated in the surface acoustic wave devices.

The inventors of the invention described and claimed in the present application discovered that, when the IDT is formed of a metal having a large density such as Ta, W, and Au, it has a serious problem of large variations in frequency due to variations in the width of the electrode fingers and the film thickness. More specifically, when the IDT is formed of Al which is very common to general surface acoustic wave devices, frequency deviations on a wafer are generally small. On the other hand, when the IDT is formed of a metal having a large density such as Ta, W, and Au, the frequency deviations are so great that the deviations on a wafer cannot be adjusted after formation of the IDT. This is because the frequency and the SAW velocity depend on the density of material for the IDT. Thus, the frequency deviations become very large even if the variations in thickness of the IDT are the same as the variations in the case of an IDT made of Al.

In order to inhibit the frequency deviations, it may be proposed that the thickness of a film made of Al having a small mass load is increased to such a degree that an SH wave can be generated. However, using the state of the art thin film forming techniques, there arises the problem that the deviations in the electrode finger width direction occurs, due to the distortion or the like of a resist film which is caused by the limit of the thickness of a resist film. For this reason, when the IDT is made of Al, it is difficult to increase the film thickness of the IDT to such a degree that an SH wave can be excited. Even if it is possible to form an IDT with a thickness that is sufficient to excite an SH wave, an electromechanical coupling coefficient obtained with such an IDT is too small to be used practically.

Further, it is generally estimated that the film thickness $H/\lambda$ (electrode thickness/wavelength of an SH wave to be excited) at which the electrode fingers of the IDT can be formed with high accuracy is within 5%. Regarding the attenuation constant (propagation loss) of a surface acoustic wave device of which the IDT is made of Al and has the above-mentioned film thickness, there arises the problem that the attenuation constant does not become zero.

SUMMARY OF THE INVENTION

In order to overcome the forgoing problems, preferred embodiments of the present invention provide a surface acoustic wave device having a very small change of the SAW velocity based on the film thickness, and the attenuation constant is nearly equal to zero measured just after the electrodes have been formed on the piezoelectric substrate.

According to one preferred embodiment of the present invention, a surface acoustic wave device includes a quartz substrate having Euler angles (0°, θ,90°±5°) in which 114°≦θ≦140°, and an IDT for exciting an SH wave disposed on the quartz substrate and made of an electrode material containing as a major component at least one of Ag, Mo, Cu, Ni, Cr, and Zn and having a density of at least about 7 g/cm$^3$, wherein the film thickness of the IDT is such that the attenuation constant is approximately zero.

When Ag is used as a major component for the electrode material, it is preferable that the normalized film thickness $H/\lambda$ of the IDT is about 0.021 to about 0.050.

When Mo is used as a major component for the electrode material, it is preferable that the normalized film thickness $H/\lambda$ of the IDT is about 0.016 to about 0.050.

When Cu is used as a major component for the electrode material, it is preferable that the normalized film thickness $H/\lambda$ of the IDT is about 0.027 to about 0.050.

When Ni is used as a major component for the electrode material, it is preferable that the normalized film thickness $H/\lambda$ of the IDT is about 0.019 to about 0.050.

When Cr is used as a major component for the electrode material, it is preferable that the normalized film thickness $H/\lambda$ of the IDT is about 0.014 to about 0.050.

When Zn is used as a major component for the electrode material, it is preferable that the normalized film thickness $H/\lambda$ of the IDT is about 0.028 to about 0.050.

According to a preferred embodiment of the present invention, the IDT is formed on a quartz substrate having Euler angles (0°, 114°≦θ≦140°, 90°±5°) using an electrode material having a density of at least about 7 g/cm$^3$. Accordingly, the resulting surface acoustic wave device has a very small change of the SAW velocity based on the film thickness, and the deviations of frequency are prevented.

Moreover, a surface acoustic wave device having an attenuation constant of about zero measured just after the electrodes have been formed on a piezoelectric substrate can be obtained by setting the normalized film thickness of IDT to a desired amount, the IDT being made of an electrode material containing as a major component at least one of Ag, Mo, Cu, Ni, Cr, and Zn and having a density of about 7 g/cm$^3$.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
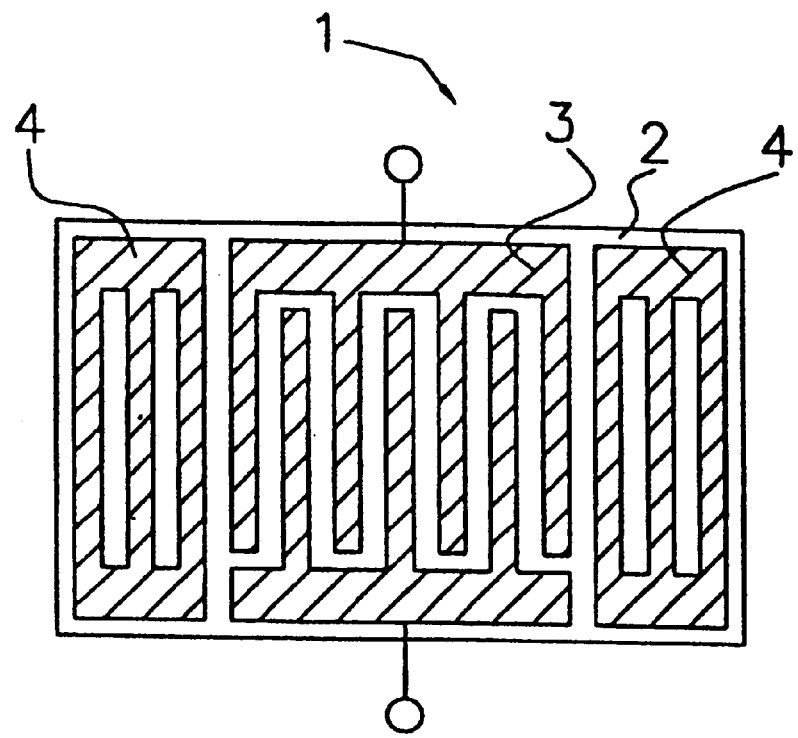
FIG. 1 is a plan view of a surface acoustic wave resonator illustrating a first preferred embodiment of the present invention.

FIG. 1 is a plan view showing a surface acoustic wave resonator defining a surface acoustic wave device according to a first preferred embodiment of the present invention.

As shown in FIG. 1, a surface acoustic wave resonator 1 preferably includes at least one IDT 3 and reflectors 4 on both sides of the IDT 3 on a piezoelectric substrate 2 made of quartz having Euler angles (0°, 114°≦θ≦140°, 90°±5°). It is preferable that θ is in the range from about 114° to about 140° so that the temperature coefficient of group delay time (TCD) is about±3 ppm/° C. It is more preferable that θ is in the range from about 119° to about 136° for the TCD of about ±2 ppm/° C.

The IDT 3 is preferably made of an electrode material containing as a major component at least one of Ag, Mo, Cu, Ni, Cr, and Zn and having a density of at least about 7 g/cm³. The IDT 3 is preferably configured such that the electrode fingers of one set of interdigital electrodes are interdigitated with each other.

The electrode fingers constituting the electrode fingers of the IDT 3 are arranged so that the normalized film thickness H/λ is within about 5%. That is, the normalized film thickness is set so as to be in the range of H/λ (the electrode thickness/wavelength of an SH wave to be excited)≦0.050.

Figure 2:
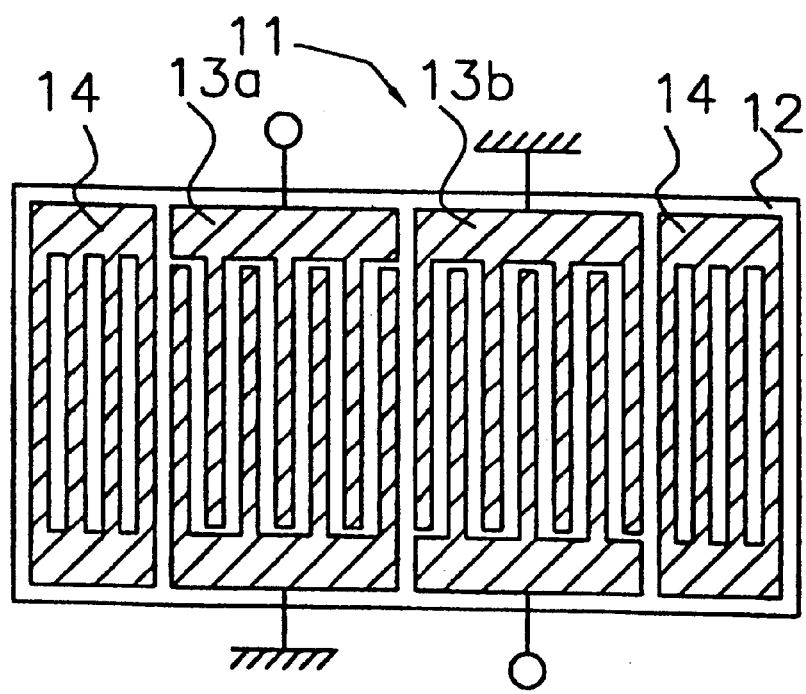
FIG. 2 is a plan view of a longitudinally coupled type surface acoustic wave filter illustrating a second preferred embodiment of the present invention.

Next, a second preferred embodiment of the present invention will be described. FIG. 2 is a plan view showing a longitudinally coupled type resonator surface acoustic wave filter defining a surface acoustic wave device according to a second preferred embodiment of the present invention.

As shown in FIG. 2, a longitudinally coupled type resonator surface acoustic wave filter 11 includes at least two IDTs 13a and 13b, and reflectors 14 on both sides of the IDTs on a piezoelectric substrate 12 made of quartz having Euler angles (0°, 114°≦θ≦140°, 90°±5°).

The IDT 13 is preferably made of an electrode material containing as a major component at least one of Ag, Mo, Cu, Ni, Cr, and Zn and having a density of at least about 7 g/cm³.

The IDT 13 is arranged so that the respective interdigital fingers of one set of interdigital electrodes are opposed to each other. Further, the IDTs 13a and 13b are arranged to be substantially parallel to each other at a constant interval in the surface acoustic wave propagation direction. Also in this preferred embodiment, the electrode fingers constituting the interdigital fingers of the IDT 13a and 13b are set such that the normalized film thickness H/λ is within about 5%, as in the first preferred embodiment, that is, the electrode fingers are arranged so that the normalized film thickness is in the range of H/λ (the electrode thickness/wavelength of an SH wave to be excited)≦0.050.

Figure 3:
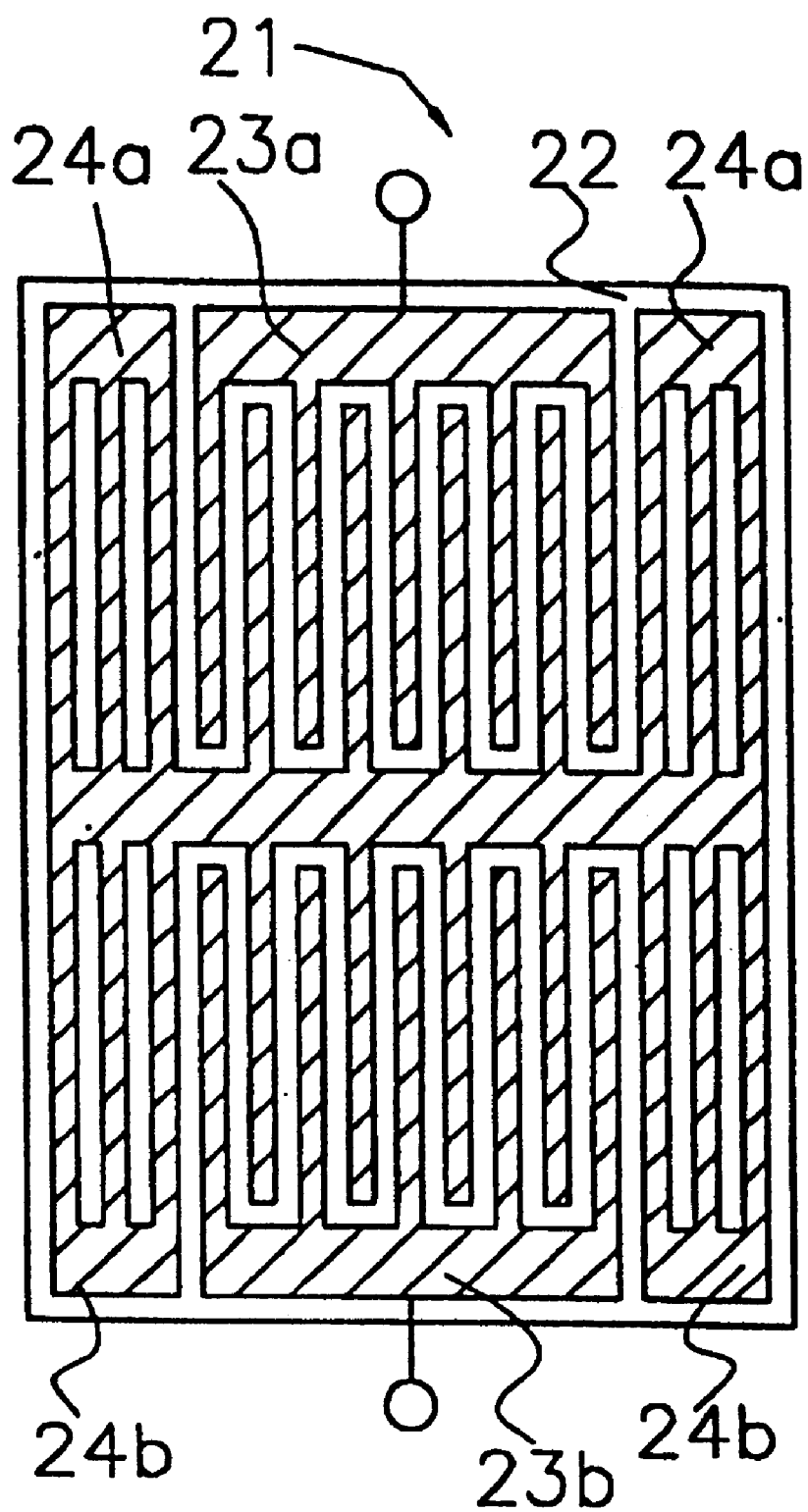
FIG. 3 is a plan view of a transversely coupled type surface acoustic wave filter illustrating a third preferred embodiment of the present invention.

Next, a third preferred embodiment of the present invention will be described. FIG. 3 is a plan view showing a transversely coupled type resonator surface acoustic wave filter according to the third preferred embodiment of the present invention.

As shown in FIG. 3, a surface acoustic wave filter 21 preferably includes at least two IDTs 23a and 23b and reflectors 24a and 24b on both sides of the IDTs on a piezoelectric substrate 22 made of quartz having Euler angles (0°, 114°≦θ≦140°, 90°±5°).

The IDTs 23a and 23b are preferably made of an electrode material containing as a major component at least one of Ag, Mo, Cu, Ni, Cr, and Zn and having a density of at least about 7 g/cm³. The IDTs 23a and 23b are arranged so that the respective interdigital fingers of one set of interdigital electrodes are opposed to each other. Further, the IDTs 23a and 23b are arranged substantially perpendicularly to the surface acoustic wave propagation direction. Also in this preferred embodiment, the electrode fingers constituting the interdigital fingers of the IDTs 23a and 23b are arranged such that the normalized film thickness H/λ is within about 5%, that is, the electrode fingers are so set that the H/λ (the electrode thickness/wavelength of an SH wave to be excited) is in the range of H/λ≦0.050.

Figure 4:
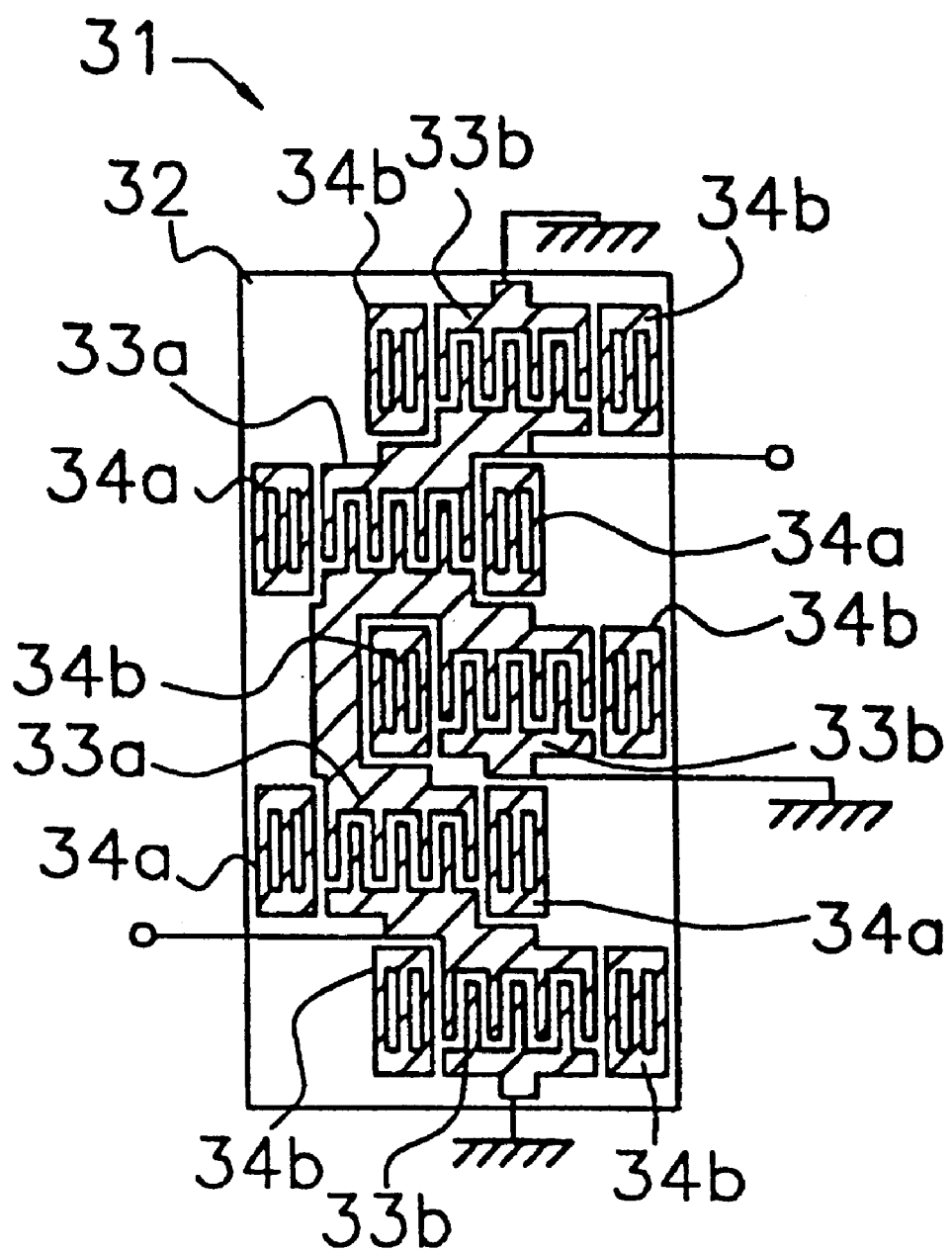
FIG. 4 is a plan view of a ladder type surface acoustic wave filter illustrating a fourth preferred embodiment of the present invention.

Next, a fourth preferred embodiment of the present invention will be described. FIG. 4 is a plan view showing a ladder type surface acoustic wave filter defining a surface acoustic wave device according to the fourth preferred embodiment of the present invention.

As shown in FIG. 4, a ladder type surface acoustic wave filter 31 preferably includes at least IDTs 33a and 33b and reflectors 34a and 34b on both sides of the IDTs on a piezoelectric substrate 32 made of quartz having Euler angles (0°, 114°≦θ≦140°, 90°±5°)

The IDTs 33a and 33b are preferably made of an electrode material containing as a major component at least one of Ag, Mo, Cu, Ni, Cr, and Zn and having a density of at least about 7 g/cm³, and have the configuration in which one set of interdigital electrodes are arranged such that the respective interdigital fingers are opposed to each other. The IDTs 33a are disposed in the series arms, and the IDTs 33b are disposed in the parallel arms whereby the surface acoustic wave filter has a ladder type configuration. Also, in this preferred embodiment, the electrode fingers constituting the interdigital fingers of the IDTs 33a and 33b are set such that the normalized film thickness H/λ is within about 5%, that is, the electrode fingers are set such that the H/λ (the electrode thickness/wavelength of SH wave to be excited) is in the range of H/λ≦0.050, as in the first to third preferred embodiments.

Figure 5:
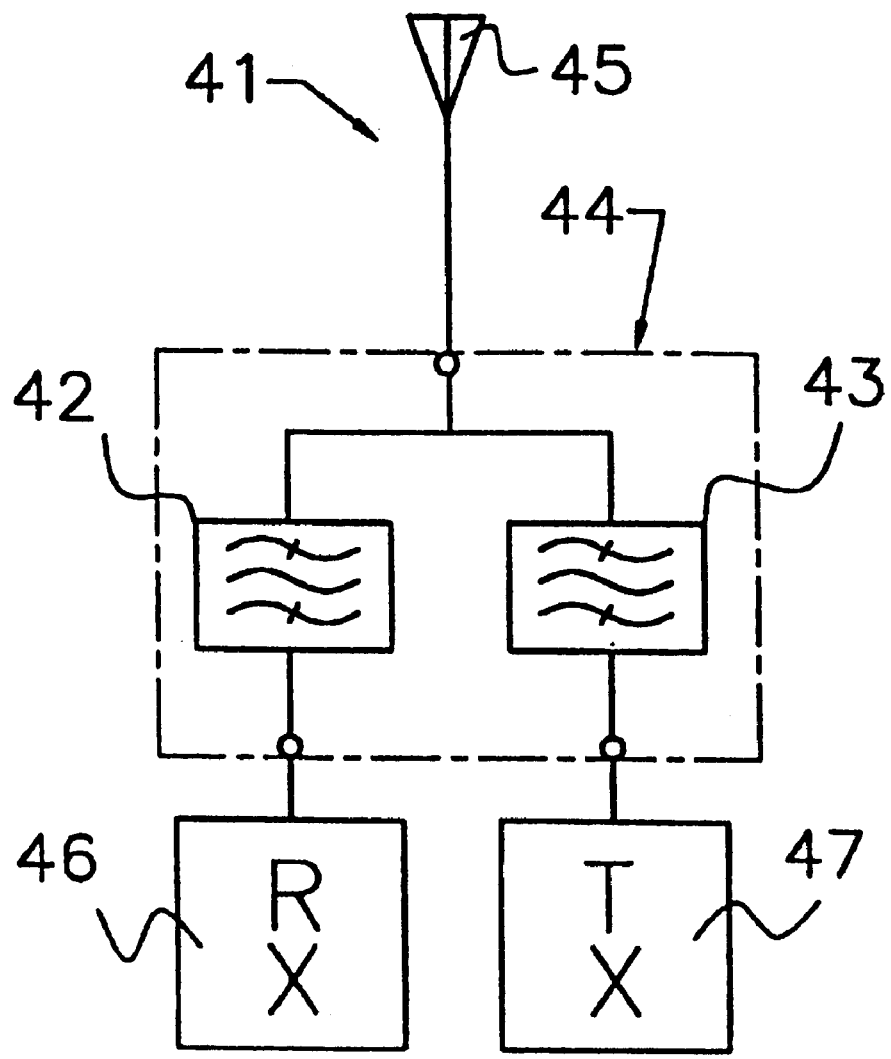
FIG. 5 is a block diagram of a communication device illustrating fifth and sixth preferred embodiments of the present invention.

Next, fifth and sixth preferred embodiments of the present invention will be described. FIG. 5 is a block diagram showing a duplexer according to the fourth preferred embodiment and a communication device according to the fifth preferred embodiment of the present invention.

As shown in FIG. 5, a communication device 41 has the configuration in which the antenna terminal of a duplexer 44 containing a reception surface acoustic wave filter 42 and a transmission surface acoustic wave filter 43 is connected to an antenna 45, the output terminal of the duplexer is connected to a reception circuit 46, and the input terminal of the duplexer is connected to a receiving circuit 47. As the reception surface acoustic wave filter 42 and the transmission surface acoustic wave filter 43 of the above-described duplexer 44, any one of the surface acoustic wave filters 11 to 21 according to the second to fourth preferred embodiments or any combination thereof may be preferably used.

Next, the normalized thickness H/λ (electrode thickness/wavelength of an SH wave to be excited) of the IDT according to a preferred embodiment of the present invention will be described by use of an example.

Figure 6:
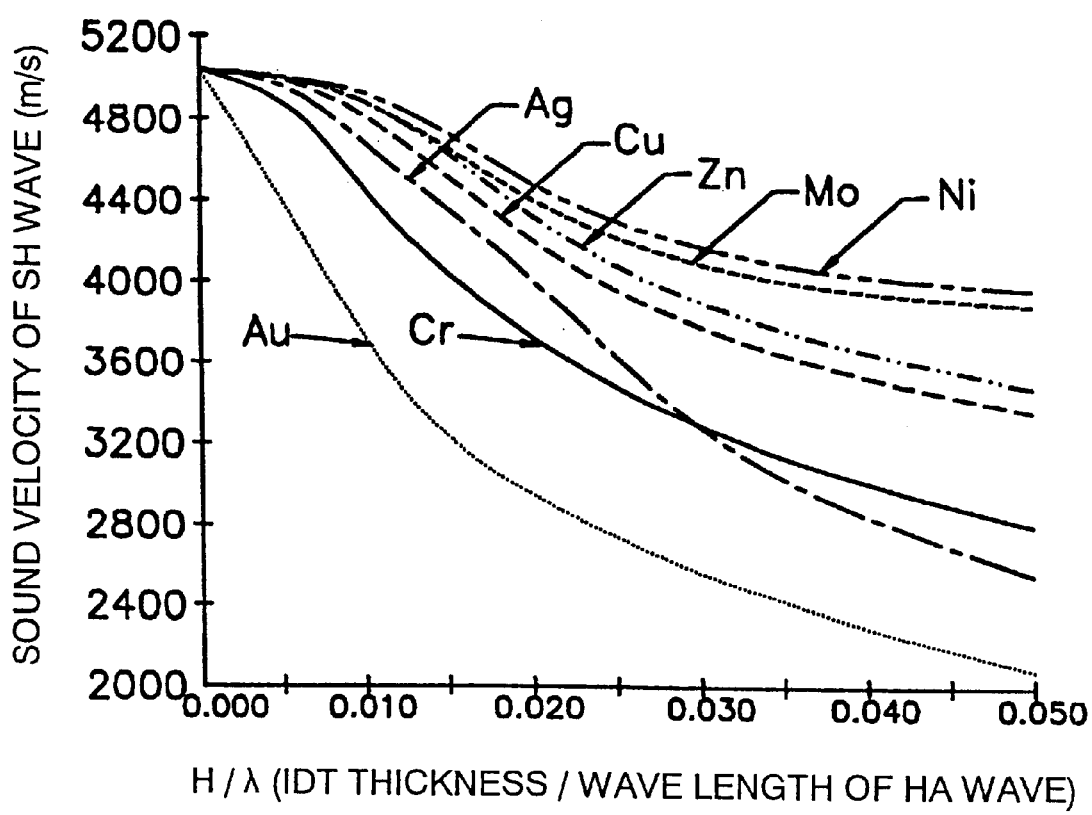
FIG. 6 is a graph illustrating the relationship between the normalized film thickness H/λ of the IDT and the change of the SAW velocity of an SH wave.

FIG. 6 is a graph showing the change of the SAW velocity of an SH wave propagating in the piezoelectric substrate when the normalized film thickness H/λ (electrode thickness/wavelength of an SH wave to be excited) on the piezoelectric substrate is changed in the range from about 0.000 to about 0.050, the graph including the case in which no electrode is formed on the piezoelectric substrate.

As seen in FIG. 6, it is understood that Ag, Mo, Cu, Ni, Cr, and Zn present the SAW velocity of an SH wave changing gently with the normalized film thickness H/λ as compared with Au. Accordingly, it is apparent that when Ag, Mo, Cu, Ni, Cr, and Zn are used as an electrode material to form the IDT, the change of the SAW velocity based on the film thickness of the IDT is small as compared with Au or other materials. That is, a surface acoustic wave device having a very small unevenness of frequency is obtained.

Figure 7:
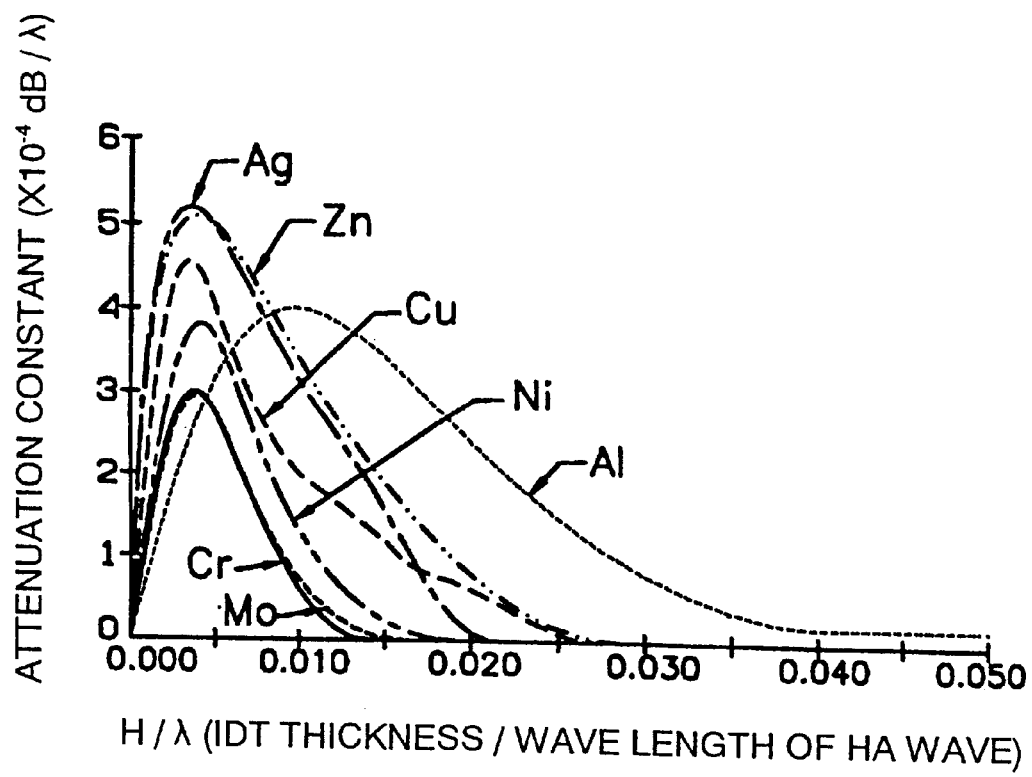
FIG. 7 is a graph illustrating the relationship between the normalized film thickness H/λ of IDT and the attenuation constant.

FIG. 7 is a graph showing the change of the attenuation constant caused when the normalized thickness H/λ (electrode thickness/wavelength of an SH wave to be excited) is varied in the range from about 0.000 to about 0.050, including the case in which no electrode is formed on the piezoelectric substrate. In this case, the measurement was carried out by use of a piezoelectric substrate having Euler angles (0°, 127°, 89°). The attenuation constant is defined as a value per λ by which an SH wave is attenuated while it propagates.

As seen in FIG. 7, it is understood that for any one of the materials, as the film thickness is increased, the attenuation constant is gradually improved. However, regarding Al, the attenuation constant is scarcely improved in the range of the normalized thickness H/λ exceeding 0.040.

On the other hand, as shown in FIG. 7, the attenuation constants are nearly zero at H/λ=0.019 for Ag, H/λ=0.016 for Mo, H/λ=0.027 for Cu, H/λ=0.019 for Ni, H/λ=0.014 for Cr, and H/λ=0.028 and higher for Zn.

As described above, by forming the IDT electrodes so that they contain as a major component at least one of Ag, Mo, Cu, Ni, Cr, and Zn, on a quartz substrate having Euler angles (0°, θ, 90°±5°) in which (119°≦θ≦136°), a surface acoustic wave device having a very small change in SAW velocity based on the film thickness, and an attenuation constant that is nearly zero, measured after the electrodes have been formed on the piezoelectric substrate, is obtained.

In this preferred embodiment Ag, Mo, Cu, Ni, Cr, and Zn are described. The present invention is not limited to these materials. Their alloys such as Advance(density 8.9 g/cm$^3$), Alchrome(density 7.1 g/cm$^3$), Alumel(density 8.7 g/cm$^3$), Brass(density 8.43 g/cm$^3$), (Ceramawire)(density 8.92 g/cm$^3$), Chromel(density 8.5 g/cm$^3$), Constantan(density 8.9 g/cm$^3$), beryllium copper(density 8.23 g/cm$^3$), copper tungsten(density 13.8 g/cm$^3$), Dumet(density 8 g/cm$^3$), Gilding metal(density 8.75 g/cm$^3$), Hastelloy(density 8.9 g/cm$^3$), (Herber)(density 8.3 g/cm$^3$), Inconel600(density 8.42 g/cm$^3$), Inconel601(density 8.11 g/cm$^3$), Inconel625 (density 8.44 g/cm$^3$), Inconel690 (density 8.19 g/cm$^3$), InconelX-750(density 8.25 g/cm$^3$), Incoloy800(density 7.05 g/cm$^3$), Incoloy825(density 8.14 g/cm$^3$), 36 Invar(density 8.15 g/cm$^3$), 42 Invar(density 8.2 g/cm$^3$), Super-invar (density 8.2 g/cm$^3$), iron-chrome 10(density 7.78 g/cm$^3$), iron-chrome 30(density 7.2 g/cm$^3$), Kanthal(density 8.5 g/cm$^3$), Manganin(density 8.4 g/cm$^3$), (Moleculoy)(density 8.11 g/cm$^3$), Monel(density 8.83 g/cm$^3$), Mumetal(density 8.8 g/cm$^3$), nickel-beryllium(density 8.74 g/cm$^3$), nickel-chrome (density 8.41 g/cm$^3$), nickel-silver(density 8.72 g/cm$^3$), 45 Permalloy (density 8.25 g/cm$^3$), 78 Permalloy (density 8.6 g/cm$^3$), phosphor bronze (density 8.9 g/cm$^3$), silver-copper(density 10.1 g/cm$^3$), stainless SUS-301 (density 7.9 g/cm$^3$), stainless SUS-302 (density 7.9 g/cm$^3$), stainless SUS-304(density 7.9 g/cm$^3$), tin-lead(density 8.42 g/cm$^3$), molybdenum alloy (density 10.18 g/cm$^3$), Waspaloy (density 8.18 g/cm$^3$), and so forth, having a density of at least 7.1 g/cm$^3$, substantially at least 7 g/cm$^3$ provide for the same tendency as described above.

In the first to sixth preferred embodiments of the present invention, the surface acoustic wave devices having reflectors are described. The present invention is not limited to the above-described surface acoustic wave devices, and can be applied to a surface acoustic wave device having no reflector.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a substrate having Euler angles (0°, θ, 90°±5°) in which θ is in the range of 119°≦θ≦140°; and
   at least one IDT arranged to generate a Shear Horizontal wave and disposed on the substrate, the at least one IDT being made of an electrode material containing as a major component at least one of Ag, Mo, Cu, Ni, Cr, and Zn and having a density of at least about 7 g/cm$^3$;
   wherein
   the film thickness of the at least one IDT is such that the attenuation constant is approximately zero.

2. A surface acoustic wave device according to claim 1, wherein the substrate is made of quartz.

3. A surface acoustic wave device according to claim 1, wherein the electrode material of the at least one IDT has Ag as a major component and the normalized film thickness H/λ of the at least one IDT is equal to about 0.021 to about 0.050.

4. A surface acoustic wave device according to claim 1, wherein the electrode material of the at least one IDT has Mo as a major component and the normalized film thickness H/λ of the at least one IDT is equal to about 0.016 to about 0.050.

5. A surface acoustic wave device according to claim 1, wherein the electrode material of the at least one IDT has Cu as a major component and the normalized film thickness H/λ of the at least one IDT is equal to about 0.027 to about 0.050.

6. A surface acoustic wave device according to claim 1, wherein the electrode material of the at least one IDT has Ni as a major component and the normalized film thickness H/λ of the at least one IDT is equal to about 0.019 to about 0.050.

7. A surface acoustic wave device according to claim 1, wherein the electrode material of the at least one IDT has Cr as a major component and the normalized film thickness H/λ of the at least one IDT is equal to about 0.014 to about 0.050.

8. A surface acoustic wave device according to claim 1, wherein the electrode material of the at least one IDT has Zn as a major component and the normalized film thickness H/λ of the at least one IDT is equal to about 0.028 to about 0.050.

9. A surface acoustic wave device according to claim 1, further comprising a pair of reflectors provided on both sides of the at least one IDT on the substrate.

10. A surface acoustic wave device according to claim 1, wherein the surface acoustic wave filter is a longitudinally coupled type surface acoustic wave filter.

11. A surface acoustic wave device according to claim 1, wherein the surface acoustic wave filter is a transversely coupled type surface acoustic wave filter.

12. A surface acoustic wave device according to claim 1, wherein the surface acoustic wave filter is a ladder type filter.

13. A surface acoustic wave device according to claim 1, further comprising at least two IDTs and reflectors on both sides of the IDTs.

14. A surface acoustic wave device according to claim 13, wherein the substrate is made of quartz having Euler angles (0°, 114°≦θ≦140°, 90°±5°).

15. A surface acoustic wave device according to claim 1, further comprising at least two IDTs which are arranged to be substantially parallel to each other at a constant interval in the surface acoustic wave propagation direction.

16. A surface acoustic wave device according to claim 1, further comprising at least two IDTs which include electrode fingers that are arranged such that the normalized film thickness H/λ is within about 5%.

17. A surface acoustic wave device according to claim 1, further comprising at least two IDTs which are arranged substantially perpendicularly to the surface acoustic wave propagation direction.

18. A communication device comprising a surface acoustic wave device according to claim 1.

19. A communication device according to claim 18, wherein the communication device is a duplexer.

* * * * *